US010475771B2

(12) United States Patent
Zhou et al.

(10) Patent No.: US 10,475,771 B2
(45) Date of Patent: Nov. 12, 2019

(54) SEMICONDUCTOR DEVICE WITH AN ELECTRICALLY-COUPLED PROTECTION MECHANISM AND ASSOCIATED SYSTEMS, DEVICES, AND METHODS

(71) Applicant: Micron Technology, Inc., Boise, ID (US)

(72) Inventors: Wei Zhou, Boise, ID (US); Bret K. Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/878,725

(22) Filed: Jan. 24, 2018

(65) Prior Publication Data
US 2019/0229089 A1   Jul. 25, 2019

(51) Int. Cl.
*H01L 23/40*   (2006.01)
*H01L 25/065*   (2006.01)
(Continued)

(52) U.S. Cl.
CPC ........ *H01L 25/0657* (2013.01); *H01L 23/481* (2013.01); *H01L 23/4952* (2013.01);
(Continued)

(58) Field of Classification Search
CPC ....... H01L 23/481; H01L 23/00; H01L 23/48; H01L 23/10; H01L 23/16; H01L 23/17; H01L 23/495; H01L 23/552; H01L 23/4952; H01L 23/04; H01L 23/49541; H01L 24/16; H01L 24/17; H01L 24/67; H01L 24/70; H01L 24/73; H01L 24/81; H01L 24/89
(Continued)

(56) References Cited

U.S. PATENT DOCUMENTS 8,299,633 B2   10/2012   Su
9,093,364 B2    7/2015   Pagaila
(Continued)

FOREIGN PATENT DOCUMENTS

CN    102668075 A    9/2012
KR   20110125796 A   11/2011
TW     201727772 A    8/2017

OTHER PUBLICATIONS

International Application No. PCT/US2018/041746—International Search Report and Written Opinion, dated Nov. 2, 2018, 12 pages.
(Continued)

*Primary Examiner* — Chuong A Luu
(74) *Attorney, Agent, or Firm* — Perkins Coie LLP (57) ABSTRACT

A semiconductor device includes a first die; a first metal enclosure directly contacting and vertically extending below the first die, wherein the first metal enclosure peripherally encircles a first enclosed space; a second die directly contacting the first metal enclosure opposite the first die; a second metal enclosure directly contacting and vertically extending below the second die, wherein the second metal enclosure peripherally encircles a second enclosed space; and an enclosure connection mechanism directly contacting the first metal enclosure and the second metal enclosure for electrically coupling the first metal enclosure and the second metal enclosure.

15 Claims, 8 Drawing Sheets

(51) Int. Cl.
    *H01L 23/495*     (2006.01)
    *H01L 23/552*     (2006.01)
    *H01L 23/48*     (2006.01)
    *H01L 25/00*     (2006.01)
    *H01L 23/00*     (2006.01)

(52) U.S. Cl.
    CPC ...... *H01L 23/49541* (2013.01); *H01L 23/552* (2013.01); *H01L 24/16* (2013.01); *H01L 25/50* (2013.01); *H01L 2224/16227* (2013.01); *H01L 2225/0651* (2013.01); *H01L 2225/06517* (2013.01)

(58) Field of Classification Search
    USPC ........................................................ 257/659
    See application file for complete search history.

(56) References Cited

U.S. PATENT DOCUMENTS

| | | | |
|---|---|---|---|
| 9,356,009 B2 | 5/2016 | Chandolu | |
| 2003/0214029 A1 | 11/2003 | Tao et al. | |
| 2004/0014308 A1 | 1/2004 | Kellar et al. | |
| 2004/0159960 A1 | 8/2004 | Fujiwara et al. | |
| 2004/0231872 A1 | 11/2004 | Arnold et al. | |
| 2005/0135041 A1 | 6/2005 | Kang et al. | |
| 2006/0103015 A1 | 5/2006 | Farrar et al. | |
| 2007/0057357 A1 | 3/2007 | Chen | |
| 2007/0267725 A1 | 11/2007 | Lee et al. | |
| 2008/0054433 A1 | 3/2008 | Yoo et al. | |
| 2009/0014856 A1 | 1/2009 | Knickerbocker | |
| 2009/0121334 A1 | 5/2009 | Oi et al. | |
| 2009/0194861 A1 | 8/2009 | Bonse et al. | |
| 2009/0224371 A1 | 9/2009 | Yu et al. | |
| 2010/0105171 A1 | 4/2010 | Lee et al. | |
| 2010/0244208 A1 | 9/2010 | Pagaila et al. | |
| 2010/0258950 A1 | 10/2010 | Li et al. | |
| 2011/0147899 A1 | 6/2011 | Dahilig et al. | |
| 2013/0075879 A1 | 3/2013 | Yang | |
| 2013/0075923 A1* | 3/2013 | Park | H01L 25/0652 257/774 |
| 2013/0234317 A1 | 9/2013 | Chen et al. | |
| 2014/0197526 A1 | 7/2014 | Yoo et al. | |
| 2015/0014844 A1 | 1/2015 | Wu et al. | |
| 2015/0091178 A1 | 4/2015 | Reber et al. | |
| 2015/0187745 A1 | 7/2015 | Chiu et al. | |
| 2015/0333026 A1 | 11/2015 | Gandhi et al. | |
| 2015/0348954 A1* | 12/2015 | Chandolu | H01L 25/50 257/712 |
| 2017/0040309 A1 | 2/2017 | Kent | |
| 2017/0125375 A1 | 5/2017 | Chinnusamy et al. | |
| 2018/0151513 A1 | 5/2018 | Stone | |

OTHER PUBLICATIONS

U.S. Appl. No. 15/693,230—Unpublished Patent Application by Wei Zhou et al., titled "Semiconductor Device With a Protection Mechanism and Associated Systems, Devices, and Methods", filed Aug. 31, 2017, 31 pages.

U.S. Appl. No. 15/878,755—Unpublished Patent Application by Wei Zhou et al., titled "Semiconductor Device With a Layered Protection Mechanism and Associated Systems, Devices, and Methods", filed Jan. 24, 2018, 37 pages.

TW Patent Application No. 107125987—Taiwanese Office Action and Search Report, dated Apr. 10, 2019, with English Translation, 11 pages.

International Application No. PCT/US2018/063662—International Search Report and Written Opinion, dated Apr. 5, 2019, 14 pages.

\* cited by examiner

SEMICONDUCTOR DEVICE WITH AN ELECTRICALLY-COUPLED PROTECTION MECHANISM AND ASSOCIATED SYSTEMS, DEVICES, AND METHODS

RELATED APPLICATION(S)

This application contains subject matter related to a previously-filed U.S. patent application by Wei Zhou, Bret Street, and Mark Tuttle titled "SEMICONDUCTOR DEVICE WITH A PROTECTION MECHANISM AND ASSOCIATED SYSTEMS, DEVICES, AND METHODS." The related application is assigned to Micron Technology, Inc., and is identified by application Ser. No. 15/693,230, filed Aug. 31, 2017. The subject matter thereof is incorporated herein by reference thereto.

This application contains subject matter related to a concurrently-filed U.S. patent application by Wei Zhou and Bret Street titled "SEMICONDUCTOR DEVICE WITH A LAYERED PROTECTION MECHANISM AND ASSOCIATED SYSTEMS, DEVICES, AND METHODS". The related application is assigned to Micron Technology, Inc., and is identified by Ser. No. 15/878,755. The subject matter thereof is incorporated herein by reference thereto.

TECHNICAL FIELD

The present technology is related to semiconductor devices, and, in particular, to semiconductor devices with an electrically-coupled protection mechanism.

BACKGROUND

Semiconductor devices dies, including memory chips, microprocessor chips, and imager chips, typically include a semiconductor die mounted on another structure (e.g., a substrate, another die, etc.) and encased in a plastic protective covering. The die includes functional features, such as for memory cells, processor circuits, and imager devices, as well as interconnects that are electrically connected to the functional features. The interconnects can be electrically connected to terminals outside the protective covering to connect the die to higher level circuitry.

Figure 1:
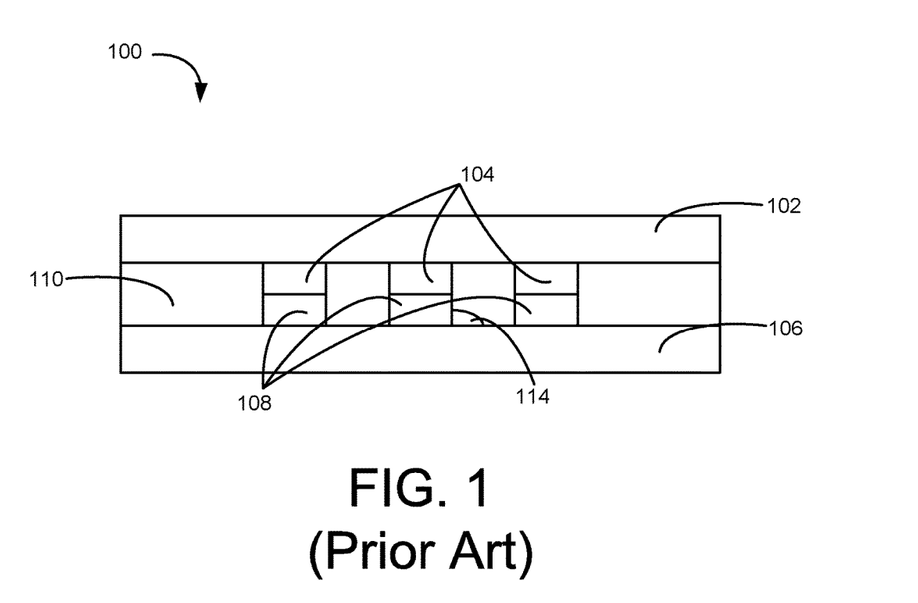
FIG. 1 is a cross-sectional view of a semiconductor device.

As illustrated in FIG. 1, a semiconductor device 100 (e.g., a three dimensional interconnect (3DI) type of device or a semiconductor package device) can include a die 102 having die interconnects 104 thereon connected to a substrate structure 106 (e.g., a printed circuit board (PCB), a semiconductor or wafer-level substrate, another die, etc.) having substrate interconnects 108 thereon. The die 102 and the substrate structure 106 can be electrically coupled to each other through the die interconnects 104 and the substrate interconnects 108. Further, the die interconnects 104 and the substrate interconnects 108 can be directly contacted each other (e.g., through a bonding process, such as diffusion bonding or hybrid bonding) or through an intermediate structure (e.g., solder). The semiconductor device 100 can further include an encapsulant, such as an underfill 110, surrounding or encapsulating the die 102, the die interconnects 104, the substrate structure 106, the substrate interconnects 108, a portion thereof, or a combination thereof.

With technological advancements in other areas and increasing applications, the market is continuously looking for faster and smaller devices. To meet the market demand, physical sizes or dimensions of the semiconductor devices are being pushed to the limit. For example, efforts are being made to reduce a separation distance between the die 102 and the substrate structure 106 (e.g., for 3DI devices and die-stacked packages).

However, due to various factors (e.g., viscosity level of the underfill 110, trapped air/gases, uneven flow of the underfill 110, space between the interconnets, etc.), the encapsulation process can be unreliable, such as leaving voids 114 between the die 102 and the substrate structure 106 (e.g., with portions of the interconnects failing to directly contact the underfill 110). The voids 114 can cause shorting and leakage between the interconnects (e.g., between the substrate interconnect 108 and/or between the die interconnects 104), causing an electrical failure for the semiconductor device 100. Further, as the device grows smaller, the manufacturing cost can grow (e.g., based on using nano-particle underfill instead of traditional underfill).

DETAILED DESCRIPTION

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or a singulated die-level substrate, another die for die-stacking or 3DI applications, or a printed circuit board (PCB). A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of protecting the semiconductor dies and the associated electrical connections and further utilizing the protection structure to relay electrical signals. For example, semiconductor devices (e.g., 3DI packaging solutions) can each include a semiconductor die with die interconnects thereon connected to a substrate structure (e.g., a PCB or another die). To protect the die and the die interconnects (e.g., against environmental factors, such as moisture, debris, etc.), the semiconductor devices can each include a metal (e.g., copper, aluminum, alloy, etc.) enclosure that surrounds the die interconnects along a horizontal plane. The metal enclosure can further extend vertically between and/or directly contact the die and the substrate to enclose the die interconnects. As such, the semiconductor devices can use the metal enclosure instead of any encapsulants (e.g., underfills) to isolate the die interconnects from surrounding exterior space and/or environment.

Further, the metal enclosure can be electrically coupled to conduct electrical signals or an electrical potential (e.g., for providing a ground connection or a source voltage). The metal enclosure can be electrically coupled using one or more through-silicon vias (TSVs), a conductive paste, one or more wires (e.g., bond wires), or a combination thereof. In some embodiments, the metal enclosure can be connected to (e.g., via a direct contact or through another conductor) an electro-magnetic interference (EMI) shield.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 2:
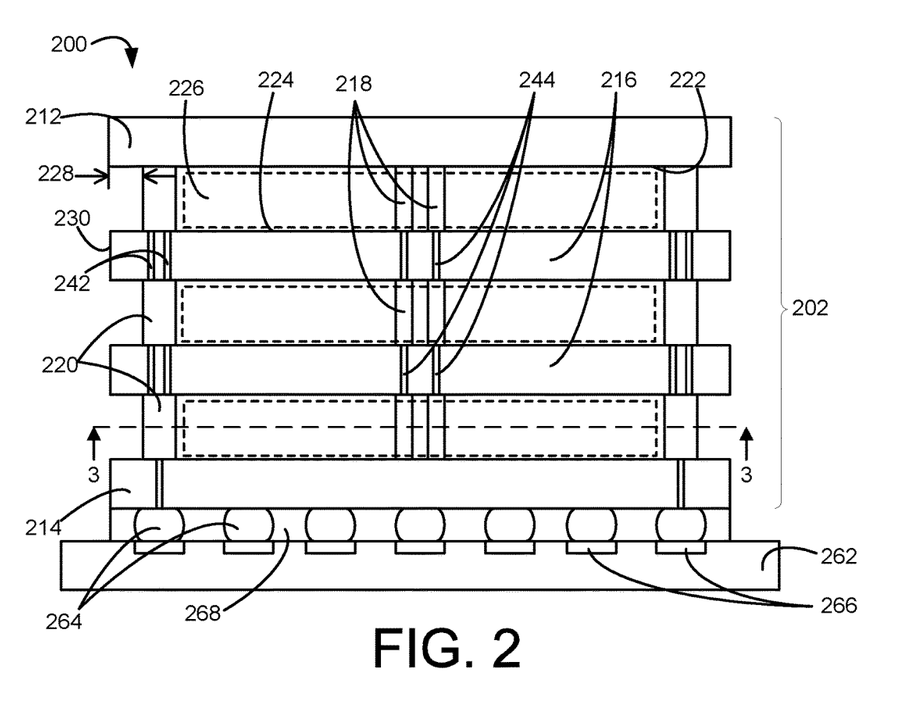
FIG. 2 is a cross-sectional view along a line 2-2 in FIG. 3 of a semiconductor device in accordance with an embodiment of the present technology.
Figure 3:
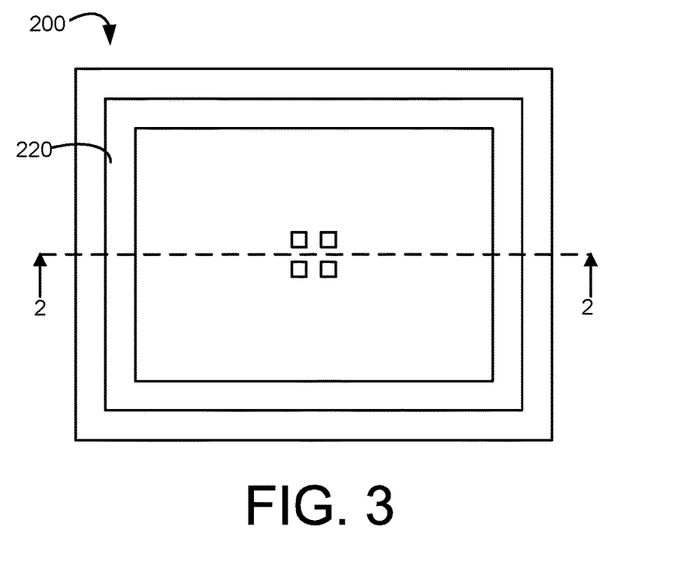
FIG. 3 is a cross-sectional view along a line 3-3 in FIG. 2 of a semiconductor device in accordance with an embodiment of the present technology.

FIG. 2 is a cross-sectional view along a line 2-2 in FIG. 3 of a semiconductor device 200 (e.g., a semiconductor die assembly, including a 3DI device or a die-stacked package) in accordance with an embodiment of the present technology. The semiconductor device 200 can include one or more semiconductor dies mounted on or connected to a substrate (e.g., another die or a PCB). For example, the semiconductor device 200 can include a die stack 202 including a first die 212 connected on top of a second die 214. In some embodiments, the die stack 202 can further include one or more inner dies 216 between the first die 212 and the second die 214.

The dies in the semiconductor device 200 can be electrically connected through metal or conductive interconnects. For example, the first die 212, the second die 214, the inner dies 216, or a combination thereof can be connected to each other and/or another structure (e.g., a PCB or another device) using internal interconnects 218. In some embodiments, the internal interconnects 218 can be structures resulting from bonding or joining (e.g., such as through diffusion bonding or hybrid bonding) pillars, pads, or interconnect structures protruding from or exposed at a first boundary surface 222 (e.g., one of the surfaces of the dies, such as a bottom surface) to the corresponding structures protruding from or exposed at a second boundary surface 224 (e.g., an opposing surface of a die or a PCB facing the first boundary surface 222, such as a top surface of a connected or an adjacent die or PCB). The first boundary surface 222 and the second boundary surface 224 can function as boundaries (e.g., such as top and bottom boundary planes) for an internal space 226 ("enclosed space 226") between the dies, between the die and the PCB, or a combination thereof.

The semiconductor device 200 can further include metal (e.g., copper, aluminum, alloy, etc.) enclosure structures 220 ("enclosures 220") that continuously surrounds or encloses the internal interconnects 218 along a horizontal plane. The enclosures 220 can each be a continuous and solid metallic (e.g., copper and/or solder) structure that forms a wall peripherally surrounding the internal interconnects 218. The enclosures 220 can further extend from and directly contact the first boundary surface 222 to and the second boundary surface 224. In some embodiments, the enclosures 220 (e.g., solid copper and/or solder structures) can be formed through a bonding process (e.g., diffusion bonding, thermal compression bonding, mass reflow, etc.). In some embodiments, the enclosures 220 can each have a vertical dimension or a height that is less than or equal to 20 μm. In some embodiments, the enclosures 220 can include solder that can be bonded through thermal compression bonding or mass reflow.

Each of the enclosures 220 can function as horizontal or peripheral boundaries (e.g., such as vertical planes marking peripheral edges along a horizontal plane) of the enclosed space 226. The enclosed space 226 can be vacuum or filled with inert or specific gas (e.g., without any encapculant material or underfill therein). Accordingly, the enclosures 220 can isolate the internal interconnects 218 from external space on the outside of the enclosures 220.

In some embodiments, an outer surface of the enclosures 220 can be located at an edge offset distance 228 (e.g., a distance measured along a horizontal direction) from a die periphery edge 230. In some embodiments, the enclosures 220 can be located such that an edge or a surface thereof is coplanar or coincident with the die periphery edge 230 along a vertical plane or line (e.g., where the edge offset distance 228 is 0). In some embodiments, the enclosures 220 can be located such that a peripheral portion thereof horizontally extends beyond the die periphery edge 230.

For the semiconductor device 200, the enclosures 220 can further provide electrical connections for one or more of the dies, structures, and/or devices therein. For example, the enclosures 220 can be connected (e.g., through direct contact and/or through another electrical conductor, such as a trace) to one or more TSVs, such as periphery TSVs 242 (e.g., one or more TSVs located on periphery portions of the corresponding semiconductor die) and/or inner TSVs 244 (e.g., one or more TSVs located on an inner or central portion of the corresponding semiconductor die). Also for example, one or more of the internal interconnects 218 can be connected to (e.g., through direct contact and/or through another electrical conductor, such as a trace) to one or more TSVs, such as the inner TSVs 244 and/or the periphery TSVs 242. The enclosures 220 can be connected to electrical ground, a source voltage, or a signal.

In some embodiments, the semiconductor device 200 can further include a device substrate 262 (e.g., a PCB) connected to one or more dies. For example, the device substrate 262 can be attached to the second die 214 (e.g., the bottom die) of the die stack 202. The device substrate 262 and the attached die can be electrically coupled through one or more interconnects and/or one or more metal enclosure structures (e.g., that are connected to the TSVs of the bottom die) as discussed above. Alternatively, the device substrate 262 can be attached to the second die 214 using device interconnects 264 (e.g., solder) different from the internal interconnects 218 and/or the enclosures 220. The device interconnects 264 can directly contact the TSVs of the bottom die and bond pads 266 on the device substrate 262. In some embodiments, an underfill 268 can be between the bottom die and the device substrate 262 and encapsulate the device interconnects 264. In some embodiments, an enclosure can be mounted between the bottom die and the device substrate 262 such that no underfill is needed.

In some embodiments, the enclosures 220 can be connected to each other (e.g., ring-to-ring and/or enclosure-to-enclosure connection) through an outer-enclosure connector, such as the periphery TSVs 242. For example, as illustrated in FIG. 2, the semiconductor device 200 can include multiple semiconductor dies and the enclosures 220. All of the dies can be aligned along one or more vertical lines or planes. Similarly, all of the enclosures can be aligned alone one or more vertical lines or planes (e.g., all of the enclosures can have same values for the edge offset distance 228). Accordingly, all of the dies can include the periphery TSVs 242 at the same location and under the enclosures (e.g., shifted from the edge offset distance 228, such as by a fraction of a thickness of the enclosures 220). In some embodiments, one or more enclosures can be further connected to the device substrate 262 (e.g., ring-to-substrate or enclosure-to-substrate connection) through the periphery TSVs 242 and/or the device interconnects 264.

As an illustrative example, the first die 212 can directly contact a first metal enclosure (e.g., one instance of the enclosures 220) at a bottom surface of the first die. The first metal enclosure can extend vertically downward and peripherally encircle or surround (e.g., along a horizontal plane) a first enclosed space a first group of the internal interconnects 218. The first metal enclosure can further directly contact another die, such as one of the inner dies, opposite the first die 212. The one of the inner dies can further have a second metal enclosure directly contacting and extending vertically downward from a bottom surface of thereof. The one of the inner dies can include one or more periphery TSVs 242 that extends through the inner dies from the top surface to the bottom surface. The one or more periphery TSVs 242 can directly contact both the first metal enclosure and the second metal enclosure and electrically couple the metal enclosures, such as for grounding the metal enclosures.

FIG. 3 is a cross-sectional view along a line 3-3 in FIG. 2 of a semiconductor device in accordance with an embodiment of the present technology. FIG. 3 can correspond to a bottom view of the semiconductor device 200 above the second die 214 of FIG. 2 (e.g., without showing the second die 214 and structures below). As discussed above, each of the enclosures 220 can encircle a periphery or a perimeter of the internal interconnects 218 along a plane.

For illustrative purposes, the enclosure is shown having a rectangular shape, uniform thickness or width, and concentric with a shape or outline of a corresponding die (e.g., one of the inner dies 216 of FIG. 2). However, it is understood that the enclosures 220 can be different. For example, the enclosures 220 can have an oval shape, an irregular or asymmetrical shape, or any N-sided polygonal shape. Also for example, the enclosures 220 can have varying thickness or width at different portions. Also for example, the enclosures 220 can be offset or non-concentric with respect to the internal interconnects 218 or an arrangement thereof, the shape or outline of the die, or a combination thereof.

The enclosures 220 provide decrease in overall size of the semiconductor device. Because underfill is not necessary, the bond line thickness can be reduced, leading to a very low packaging height for multiple-die stacking. Further, the semiconductor device 200 that excludes solder in the interconnects 218 (e.g., by using a solid copper structure, such as resulting from Cu—Cu diffusion bonding) can provide a decrease in manufacturing cost by eliminating pillar bumping. Also, the semiconductor device 200 that exclude solder in the interconnects 218 provides reduction in failure rates by providing clean joints without solder caps, thereby removing failure modes associated with solder bridging, slumping, starvation, intermetallic compound (IMC), electromagnetic (EM) effect, etc.

The enclosures 220 can also provide a reduction in manufacturing cost and failure rates as the package height is decreased. The enclosures 220 can protect and isolate the internal interconnects 218 from environmental factors (e.g., moisture, debris, etc.), which eliminates the need for underfills (e.g., nano-particle underfills). Accordingly, the costs and the error rates associated with underfill laminate or flowing process, both of which increases rapidly as the space between the first boundary surface 222 of FIG. 2 and the second boundary surface 224 of FIG. 2 decreases, can be eliminated based on using the enclosures 220 to obviate the need for underfill. Further, the enclosures 220 provide a joint that can provide mechanical, thermal, and electrical traits or benefits previously provided by the underfill.

In some embodiments, the enclosures 220 throughout the die stack 202 of FIG. 2 can be connected to each other and to the electrical ground through the periphery TSVs 242 of FIG. 2. Grounding the enclosures throughout the die stack 202 can improve the signal integrity for the die stack 202. The grounded enclosures can provide electromagnetic or radio frequency (RF) shielding for the active signals within the enclosures.

The connected enclosures (e.g., for ring-to-ring connections and/or ring-to-substrate connections) can further provide higher current-carrying capacity (e.g., for grounding or source voltage connections) with reduced interference (e.g., in the form of noise or interference) for active signals (e.g., signals through the internal interconnects 218). The enclosures and the periphery TSVs 242 can provide higher current-carrying capacity (e.g., in comparison to other interconnects) that results from increased dimensions and current-carrying material corresponding to the periphery location and the enclosing/encircling shape thereof. Further, the enclosures can be physically spaced apart or separated from the internal interconnects 218, which can decrease any noise or interference that the grounding/power connections can have on active signals. Further, the separation can further decrease the likelihood of failure due to unintended electrical shorts (e.g., such as due to misalignment or misconnection, debris or bridges, etc.) between active signals, source voltage, electrical ground, or a combination thereof.

Figure 4:
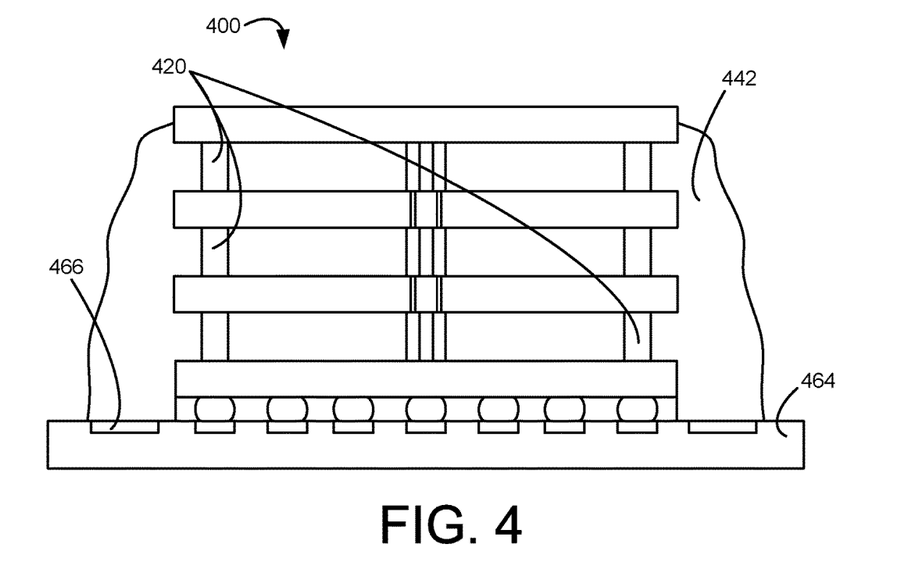
FIG. 4 is a cross-sectional view of a semiconductor device in accordance with an embodiment of the present technology.

FIG. 4 is a cross-sectional view of a semiconductor device 400 in accordance with an embodiment of the present technology. The semiconductor device 400 can be similar to the semiconductor device 200 of FIG. 2. For example, the semiconductor device 400 can include multiple dies (e.g., such as for a die stack) with internal interconnects providing electrical connections. Also for example, the semiconductor device 400 can further include one or more metal enclosure structures 420 ("enclosures 420") between dies, between a die and a device substrate, or a combination thereof with each enclosure enclosing a space (e.g., enclosed space) that includes the internal interconnects. The enclosed space can otherwise be vacuum or filled with inert or specific gas. The internal interconnects, the enclosures 420, or a combination thereof can be electrically connected to (e.g., via direct contact or through a conductor) integrated circuits, bond pads, TSVs, or a combination thereof in or on the dies.

In some embodiments, the enclosures 420 can be connected to each other (e.g., ring-to-ring and/or enclosure-to-enclosure connection) through an outer-enclosure connector, such as a conductive paste 442. For example, as illustrated in FIG. 4, the semiconductor device 400 can have a fillet of the conductive paste 442 directly contacting a periphery surface of each of the enclosures 420 (e.g., along with periphery portions of the dies). The conductive paste 442 can be continuous along a vertical direction and directly contact one or more bond pads 466 on device substrate 464 that is connected to the dies. The conductive paste 442 can provide an electrical connection between the one or more bond pads 466 (that are, e.g., electrically connected to the electrical ground, a source voltage, a reference voltage or signal, etc.) and the enclosures 420.

The conductive paste 442 can be isolated from active signals since the enclosures 420 act as barriers between the conductive paste 442 and inner/central portions of the dies and/or active surfaces thereof, internal connectors, or a combination thereof. Further the conductive paste 442 can be isolated from active signals based on an underfill material that is between the die stack and the device substrate 464 and encapsulates device interconnects that carry the active signals.

The conductive paste 442 can provide a high-current-capable ground path for the enclosures 420. Accordingly, the conductive paste 442 can provide increase RF shielding along with the enclosures 420 and improve the signal integrity (e.g., reduced interference and/or noise) of the semiconductor device 400. Further, with the enclosures 420 acting as barriers and physically separated from internal connectors, the enclosures 420 can further decrease the likelihood of failure due to unintended electrical shorts (e.g., such as due to misalignment or misconnection, debris or bridges, etc.) between active signals, source voltage, electrical ground, or a combination thereof.

Figure 5:
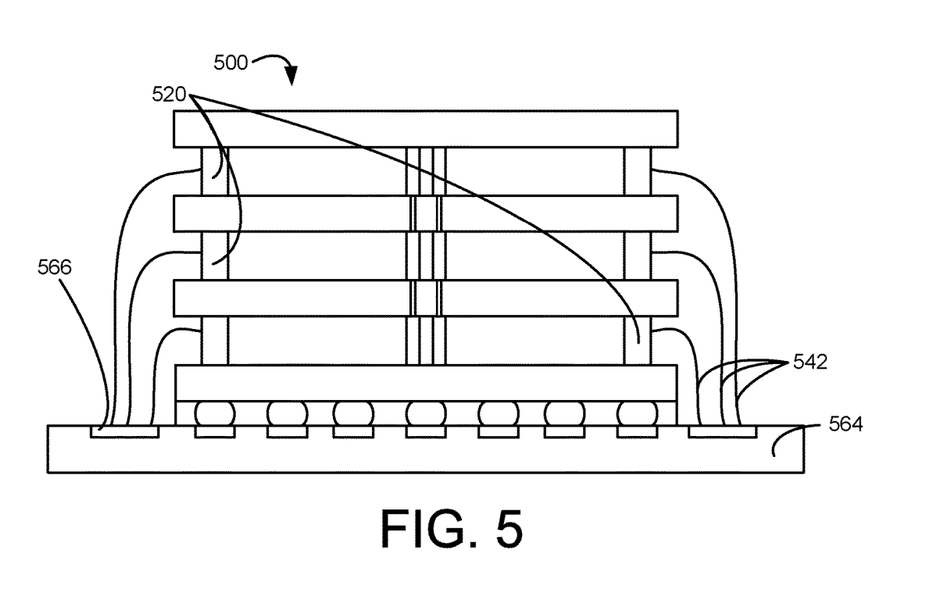
FIG. 5 is a cross-sectional view of a semiconductor device in accordance with an embodiment of the present technology.

FIG. 5 is a cross-sectional view of a semiconductor device 500 in accordance with an embodiment of the present technology. The semiconductor device 500 can be similar to the semiconductor device 200 of FIG. 2. For example, the semiconductor device 500 can include multiple dies (e.g., such as for a die stack) with internal interconnects providing electrical connections. Also for example, the semiconductor device 500 can further include one or more metal enclosure structures 520 ("enclosures 520") between dies, between a die and a device substrate, or a combination thereof with each enclosure enclosing a space (e.g., enclosed space) that includes the internal interconnects. The enclosed space can otherwise be vacuum or filled with inert or specific gas. The internal interconnects, the enclosures 520, or a combination thereof can be electrically connected to (e.g., via direct contact or through a conductor) integrated circuits, bond pads, TSVs, or a combination thereof in or on the dies.

In some embodiments, the enclosures 520 can be connected to each other (e.g., ring-to-ring and/or enclosure-to-enclosure connection) through an outer-enclosure connector, such as bond wires 542. For example, as illustrated in FIG. 5, the semiconductor device 500 can have a bond wire directly contacting a periphery surface of one or more of the enclosures 520. The bond wires 542 can further directly contact one or more bond pads 566 on device substrate 564 that is connected to the dies, and provide an electrical connection between the one or more bond pads 566 (e.g., for providing a connection to the electrical ground, a source voltage, a reference voltage or signal, etc.) and the enclosures 520. Also for example, the semiconductor device 500 can have the bond wires directly contacting and connecting the enclosures 520 (i.e., without going through the bond pads 566), such as daisy-chained wiring schemes.

The exposed periphery surface of the enclosures 520 can provide greater surface area than a connection pad on the dies and/or bond pads that correspond to active signals. As such, each of the enclosures 520 can connect to multiple bond wires and/or thicker gauge wires to provide a high-current-capable ground path. Accordingly, the bond wires 542 and the enclosures 520 can provide increase RF shielding and improve the signal integrity (e.g., reduced interference and/or noise) of the semiconductor device 500.

Figure 6:
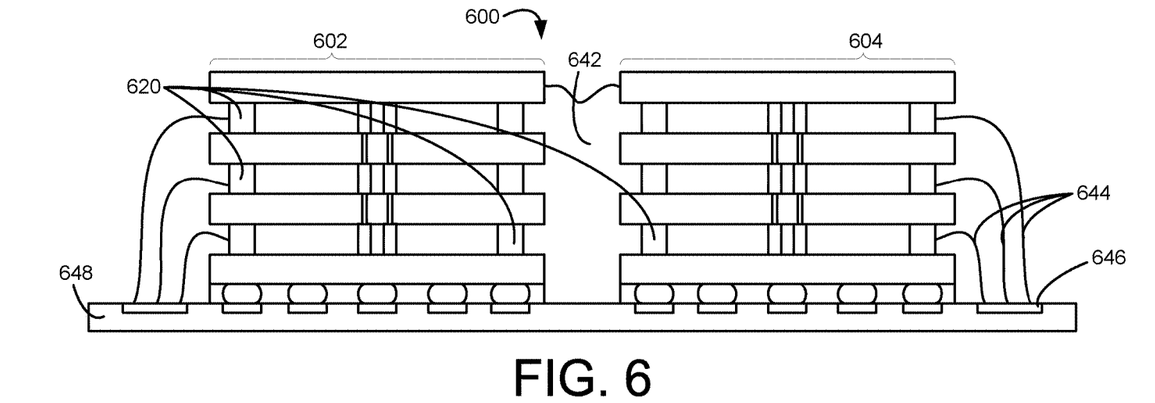
FIG. 6 is a cross-sectional view of a semiconductor device in accordance with an embodiment of the present technology.

FIG. 6 is a cross-sectional view of a semiconductor device 600 in accordance with an embodiment of the present technology. The semiconductor device 600 can be similar to the semiconductor device 200 of FIG. 2. For example, the semiconductor device 600 can include multiple dies, such as arranged in multiple stacks. The semiconductor device 600 can include a first die stack 602 and a second die stack 604. Each die stack can include multiple dies with internal interconnects providing electrical connections.

Also for example, one or more stacks (e.g., the first die stack 602 and/or the second die stack 604) of the semiconductor device 600 can further include multiple metal enclosure structures 620 ("enclosures 620") between dies, between a die and a device substrate, or a combination thereof with each enclosure enclosing a space (e.g., enclosed space) that includes the internal interconnects. The enclosed space can otherwise be vacuum or filled with inert or specific gas. The internal interconnects, the enclosures 620, or a combination thereof can be electrically connected to (e.g., via direct contact or through a conductor) integrated circuits, bond pads, TSVs, or a combination thereof in or on the dies.

In some embodiments, the enclosures 620 can be connected to each other (e.g., ring-to-ring and/or enclosure-to-enclosure connection, including connections within each die stack and/or across die stacks) through an outer-enclosure connector, such as a conductive paste 642 and/or bond wires 644. For example, as illustrated in FIG. 6, the semiconductor device 600 can have the conductive paste 642 directly contacting a periphery surface of each of the enclosures 620 (e.g., along with periphery portions of the dies) for multiple die stacks. As illustrated in FIG. 6, the conductive paste 642 can be between the first die stack 602 and the second die stack 604, directly contacting the enclosures 620 in both the first die stack 602 and the second die stack 604. The conductive paste 642 can provide electrical connection across the enclosures 620 of multiple die stacks. In some embodiments, the conductive paste 642 can further contact one or more bond pads 646 on a device substrate 648 that is connected to the die stacks.

In some embodiments, the enclosures 620 can further be connected to each other through the bond wires 644. One end of each of the bond wires 644 can be directly attached to one of the enclosures 620. The opposing end of the bond wires 644 can be directly attached to one or more bond pads 646. The bond pads 646 can provide a connection to the electrical ground, a source voltage, a reference voltage or signal, etc. In some embodiments, one or more of the bond wires 644 can be used to directly contact and connect the enclosures 620 across the first die stack 602 and the second die stack 604. For example, the one or more of the bond wires 644 can extend along a horizontal direction between the first die stack 602 and the second die stack 604 and directly contact the enclosures thereof. Accordingly, the one or more of the bond wires 644 can electrically connect the enclosures in the different die stacks, similarly as the conductive paste 642 illustrated in FIG. 6.

The conductive paste 642 directly contacting and electrically shorting the enclosures 620 across multiple/adjacent die stacks can provide high-current power or ground connection between the die stacks that doesn't pass through an interposer. For example, the conductive paste 642 can bridge together the enclosures 620 across adjacent high bandwidth memory (HBM) stacks. The conductive paste 642 can provide a shorter path (e.g., in comparison to a path through other conductors or circuitry). The shorter path can further eliminate ground loops that interfere with signal integrity for the semiconductor device 600.

Figure 7:
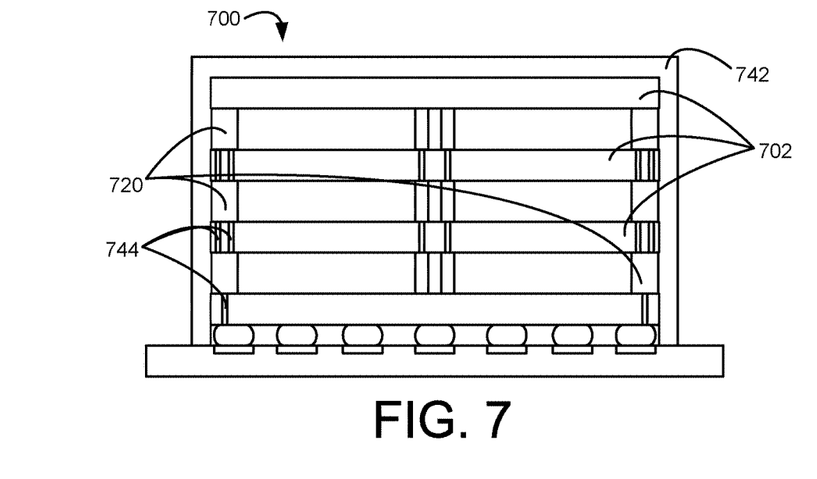
FIG. 7 is a cross-sectional view of a semiconductor device in accordance with an embodiment of the present technology.

FIG. 7 is a cross-sectional view of a semiconductor device in accordance with an embodiment of the present technology. The semiconductor device 700 can be similar to the semiconductor device 200 of FIG. 2. For example, the semiconductor device 700 can include multiple dies 702 (e.g., such as for a die stack) with internal interconnects providing electrical connections. Also for example, the semiconductor device 700 can further include one or more metal enclosure structures 720 ("enclosures 720") between the dies 702, between a die and a device substrate, or a combination thereof with each enclosure enclosing a space (e.g., enclosed space) that includes the internal interconnects. The enclosed space can otherwise be vacuum or filled with inert or specific gas. The internal interconnects, the enclosures 720, or a combination thereof can be electrically connected to (e.g., via direct contact or through a conductor) integrated circuits, bond pads, TSVs, or a combination thereof in or on the dies.

In some embodiments, the enclosures 720 can be further connected to each other (e.g., ring-to-ring and/or enclosure-to-enclosure connection) through an outer-enclosure connector, such as a metal shield 742 (e.g., an EMI or RF shield) and/or periphery TSVs 744. For example, as illustrated in FIG. 7, the semiconductor device 700 can have the metal shield 742 directly contacting, connected to (e.g., via solder, conductive paste, etc.), or integral with (e.g., via a diffusion bonding process) a periphery surface of one or more of the enclosures 720 (e.g., along with periphery portions of the dies). The metal shield 742 can encompass or surround the dies (e.g., the die stack) over the device substrate. Also for example, one or more of the dies in the semiconductor device 700 can include the periphery TSVs 744 directly connected to the enclosures 720. When the rings are grounded (e.g., through the periphery TSVs 744), the metal shield 742 can be grounded through the direct contact with the enclosures 720, eliminating any need for an electrical connection between the metal shield 742 and a device substrate.

Figure 8:
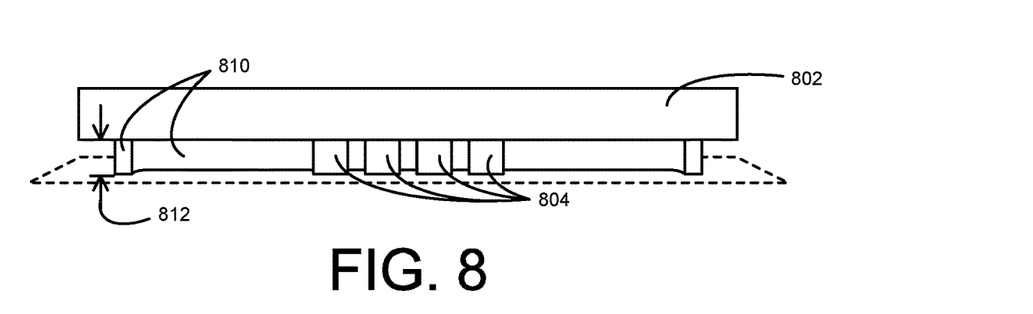
FIGS. 8-11 are cross-sectional views illustrating a semiconductor device at selected stages in a manufacturing method in accordance with an embodiment of the present technology.
Figure 9:
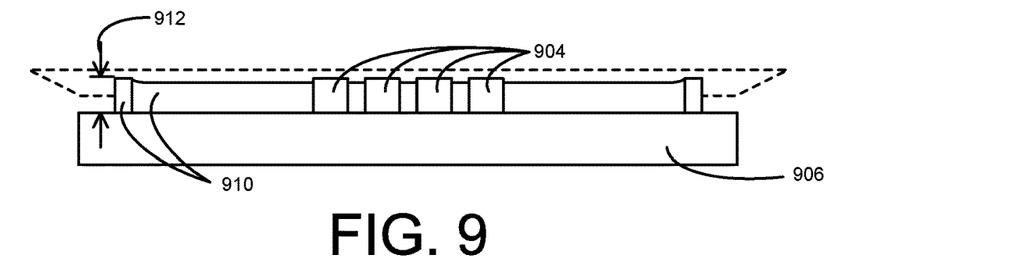

FIGS. 8-9 are cross-sectional views illustrating a semiconductor device at selected stages in a manufacturing method in accordance with an embodiment of the present technology. As illustrated in FIG. 8, the method can include a stage for providing a first die 802. The first die 802 can include first-die interconnects 804 (e.g., solid metal structures for providing electrical connections to circuits within the first die 802, such as for a portion of the internal interconnects) protruding below a first die bottom surface. The first die 802 can further include a first-die enclosure 810 (e.g., a solid metal structure, such as for a portion of the metal enclosure structure) encircling a perimeter of the first die interconnects 804 along a horizontal plane.

The first die 802 with the die interconnects 804 and the die enclosure 806 can be manufactured using a separate manufacturing process (e.g., wafer or die level manufacturing process). The separate manufacturing process can produce the die interconnects 804 and the die enclosure 806 according to a protrusion measure 812 (e.g., a height of the metal structures, such as a length measured between the die bottom surface and a distal portion of the die interconnects 804 and the die enclosure 806). In some embodiments, the protrusion measure 812 can include a distance less than 20 μm. According to the protrusion measure 812, the distal portions (e.g., relative to the die bottom surface) of the die interconnects 804 and the die enclosure 806 can be coplanar along a horizontal plane that is parallel with the die bottom surface. In some embodiments, the separate manufacturing process can include forming one or more TSVs (e.g., inner TSVs and/or periphery TSVs) directly contacting the interconnects and/or the enclosure.

As illustrated in FIG. 9, the method can include a stage for providing a substrate 906 (e.g., a PCB or another die, such as the second die, one of the inner dies, etc.). The substrate 906 can include substrate interconnects 904 (e.g., solid metal structures for providing electrical connections to the substrate 906, such as for a portion of the internal interconnects) protruding above a substrate top surface. The substrate 906 can further include a substrate enclosure 910 (e.g., a solid metal structure, such as for a portion of the metal enclosure structure) encircling a perimeter of the substrate interconnects 904 along a horizontal plane.

Figure 10:
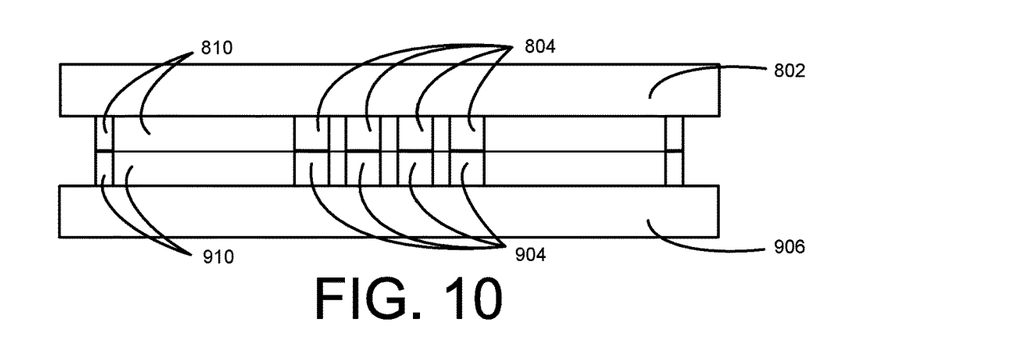

The substrate 906 with the substrate interconnects 904 and the substrate enclosure 910 can be manufactured using a separate manufacturing process (e.g., wafer or die level manufacturing process or a process for manufacturing a printed circuit board). Similar to the stage illustrated in FIG. 8, the separate manufacturing process can produce the substrate interconnects 904 and the substrate enclosure 910 according to a protrusion measure 912 (e.g., a height of the metal structures, such as a length measured between the second boundary surface 224 and a distal portion of the substrate interconnects 904 and the substrate enclosure 910). In some embodiments, the protrusion measure 912 can include a distance less than 20 μm. According to the protrusion measure 912, the distal portions (e.g., relative to the substrate top surface) of the substrate interconnects 904 and the substrate enclosure 910 can be coplanar along a horizontal plane that is parallel with the substrate top surface. In some embodiments, the separate manufacturing process can include forming one or more TSVs (e.g., inner TSVs and/or periphery TSVs) directly contacting the interconnects and/or the enclosure As illustrated in FIG. 10, the method can include a stage for aligning the substrate 906 and the die 802. The substrate 906 and the die 802 can be aligned based on aligning reference portions (e.g., a center portion, a periphery edge or surface, etc.) thereof along a line or a plane (e.g., a vertical line or plane for FIG. 10). The structures can be aligned such that the die enclosure 810 and the substrate enclosure 910 are aligned along a line or a plane (e.g., a vertical line or plane). Further, the structures can be aligned such that the die enclosure 810 and the substrate enclosure 910 directly contact each other. The die interconnects 804 and the substrate interconnects 904 can be similarly aligned.

Figure 11:
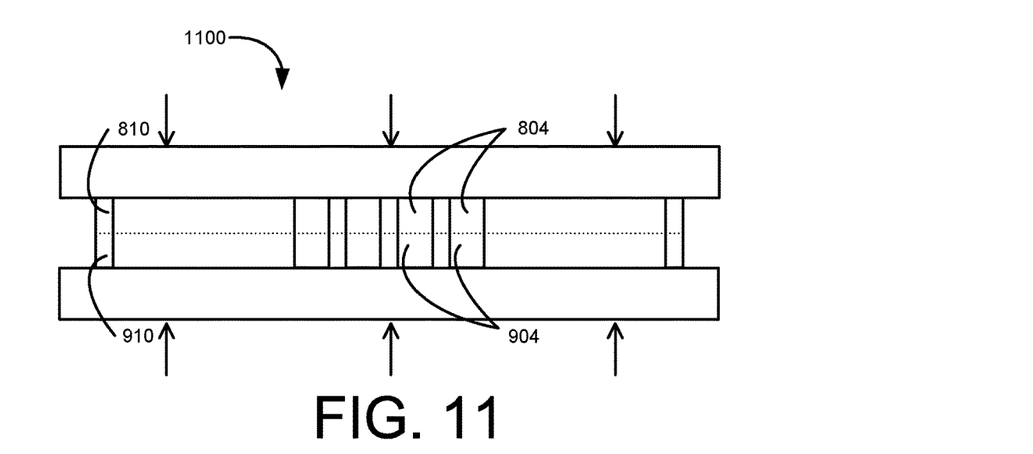

As illustrated in FIG. 11, the method can include a stage for bonding the metal structures (e.g., the die enclosure 810 to the substrate enclosure 910 and/or the die interconnects 804 to the substrate interconnects 904). For example, FIG. 11 can represent a diffusion bonding process 1100 (e.g., Cu—Cu diffusion bonding) that includes a solid-state welding process (e.g., utilizing coalescence at temperatures essentially below the melting point of the structures, with or without pressure/force pushing the structures together) for joining metals based on solid-state diffusion. The diffusion bonding process 1100 can include creating a vacuum condition or filling the space (e.g., the enclosed space) with inert gas, heating the metal structures, pressing the metal structures together, or a combination thereof.

Based on the bonding stage, the metal structures can bond or fuse and form a continuous structure. For example, the die enclosure 810 and the substrate enclosure 910 can be bonded to form the enclosures 220 of FIG. 2, the enclosures 420 of FIG. 4, the enclosures 520 of FIG. 5, the enclosures 620 of FIG. 6, the enclosures 720 of FIG. 7, or a combination thereof. Also for example, the die interconnects 804 and the substrate interconnects 904 can be bonded to form the internal interconnects (such as for 218 of FIG. 2).

Diffusion bonding the die enclosure 810 to the substrate enclosure 910 (e.g., Cu—Cu diffusion bonding) and the die interconnects 804 and the substrate interconnects 904 (e.g., Cu—Cu diffusion bonding) provides reduced manufacturing failures and cost. The diffusion bonding process can eliminate solder, thereby reducing any potential failures and costs associated with the soldering process. Further, the interconnects and the enclosures can be bonded using one bonding process, which can further simply the manufacturing process.

Figure 12:
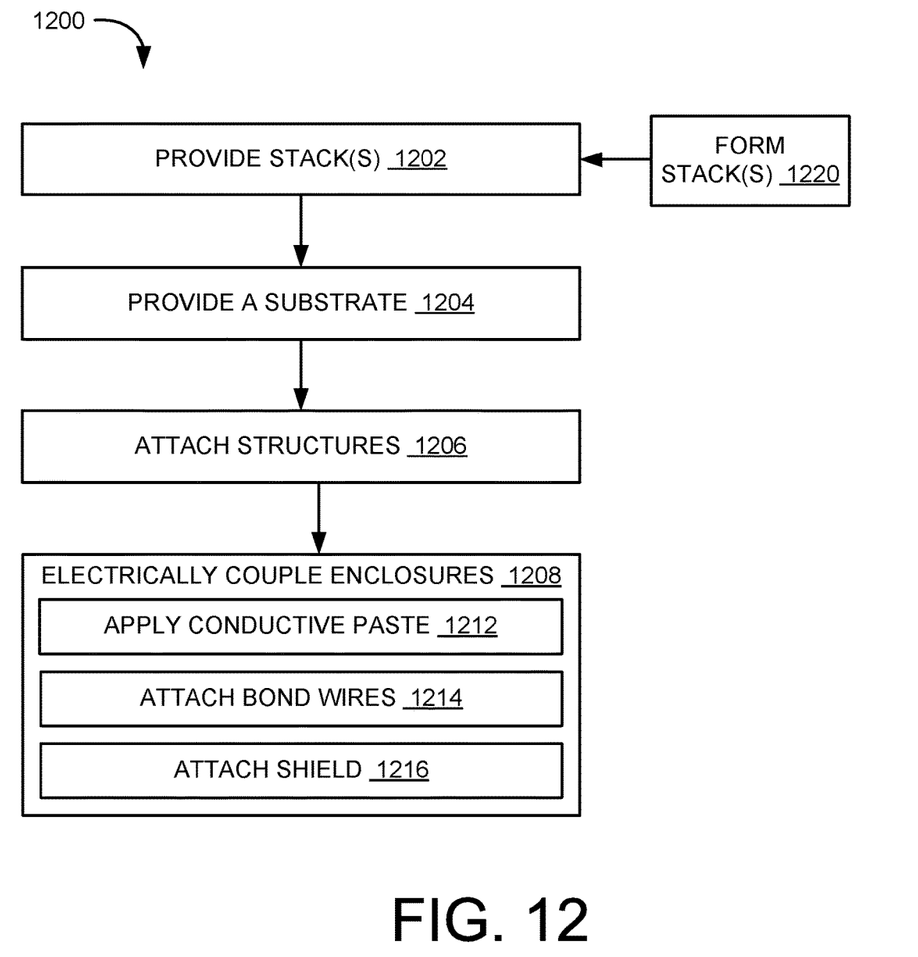
FIG. 12 is a flow diagram illustrating an example method of manufacturing a semiconductor device in accordance with an embodiment of the present technology.

FIG. 12 is a flow diagram illustrating an example method 1200 ("method 1200") of manufacturing a semiconductor device in accordance with an embodiment of the present technology. For example, the method 1200 can be implemented to manufacture the semiconductor device 200 of FIG. 2, the semiconductor device 300 of FIG. 3, the semiconductor device 400 of FIG. 4, the semiconductor device 500 of FIG. 5, the semiconductor device 600 of FIG. 6, and/or the semiconductor device 700 of FIG. 7. Also for example, the method 1200 can include stages illustrated in FIGS. 8-11.

The method 1200 can include providing one or more semiconductor die stacks (e.g., the die stack 202 of FIG. 2, the die stack of FIG. 4, the die stack of FIG. 5, the first die stack 602 of FIG. 6, the second die stack 604 of FIG. 6, the die stack of FIG. 7, etc.), such as the die stacks formed according to stages illustrated in FIGS. 8-11 (e.g., semiconductor/wafer level processes, as illustrated in block 1220), as illustrated at block 1202. The one or more semiconductor die stacks can include multiple metal enclosures (e.g., the enclosures 220 of FIG. 2, the enclosures 420 of FIG. 4, the enclosures 520 of FIG. 5, the enclosures 620 of FIG. 6, the enclosures 720 of FIG. 7, etc.) disposed between multiple semiconductor dies (e.g., the top die, one or more middle dies, the bottom die, etc. as illustrated in FIGS. 2-7).

For example, the die stack can include a first metal enclosure that directly contacts and vertically extend below from a bottom surface of a top die. The first metal enclosure can directly contact a top surface of an adjacent die opposite the bottom surface of the top die. The die stack can further include a second metal enclosure that directly contacts and vertically extend below from a bottom surface of the adjacent die, and further directly contacts a next adjacent die.

The enclosures in each of the stacks can encircle or surround internal interconnects (e.g., conductors for communicating active signals to/from/between dies). Each of the enclosures can further surround or enclose an enclosed space between a pair of dies. The enclosed spaces can be vacuum or a gas. Otherwise, the die stack can be without any underfill or encapsulation between the dies and/or within the enclosed spaces.

In some embodiments, the die stacks can include solder bumps (e.g., device interconnects) attached to a bottom surface of a bottom die in the die stack. In some embodiments, the die stacks can also include underfill directly on the bottom surface of the bottom die. The underfill can encompass the solder bumps.

The method 1200 can include providing a substrate (e.g., the device substrate, such as a PCB, illustrated in FIG. 2 and/or FIGS. 4-7) as illustrated at block 1204. In some embodiment, providing the substrate can include manufacturing the substrate, such as based on forming traces, vias, masks, etc., and/or based on attaching/connecting circuit components to the substrate. In some embodiments, providing the substrate can include positioning and/or attaching to a frame for further processing.

The method 1200 can include attaching the structures as illustrated at block 1206. For example, one or more die stacks can be attached to the substrate, such as based on reflowing the solder flows. For attaching multiple die stacks to the substrate, the die stacks can be separated or spaced apart from each other along horizontal directions. Accordingly, a gap or a separation space can be between a pair/set of die stacks.

The method 1200 can include electrically coupling the enclosures using one or more enclosure connection mechanisms (e.g., the periphery TSVs 242 of FIG. 2, the conductive paste 442 of FIG. 4 and 642 of FIG. 6, the bond wires 544 of FIG. 5, the metal shield 742 of FIG. 7, etc.) as illustrated at block 1208. For example, the enclosure connection mechanism can directly contact and electrically couple together multiple enclosures within the die stack. Also for example, the enclosure connection mechanism can directly contact and electrically couple together multiple enclosures across multiple die stacks.

In some embodiments, electrically coupling the enclosures can include applying a fillet of the conductive paste 442 to the enclosures as illustrated at block 1212. The conductive paste 442 can be applied as a continuous fillet extending in a vertical direction and directly contacting the metal enclosures within the die stack, such as illustrated in FIG. 4. The conductive paste 442 can also be applied to fill a space or a gap between a pair/set of die stacks, such that the conductive paste 442 directly contacts the metal enclosures across multiple die stacks, such as illustrated in FIG. 6.

In some embodiments, electrically coupling the enclosures can include attaching the bond wires 544 to the enclosures as illustrated at block 1214. The bond wires 544 can be attached to the metal enclosures at one end. Opposite the metal enclosures, the bond wires 544 can be attached to one or more bond pads on the device substrate. In some embodiments, the bond wires 544 can each be connected to a pair of adjacent enclosures, such as for daisy-chained wiring schemes.

In some embodiments, electrically coupling the enclosures can include attaching the metal shield 742 to the enclosures, the dies, and/or the device substrate as illustrated at block 1216. The metal shield 742 can be placed or attached to surround the die stack and the dies therein.

In some embodiments, the metal shield 742 can directly contact the metal enclosures in the die stack. In some embodiments, the metal shield 742 can be attached and/or integral with the enclosures. For example, the metal shield 742 can be attached to the enclosures using solder. Also for example, the metal shield 742 can be bonded to the metal enclosures, such as through a diffusion bonding process.

Figure 13:
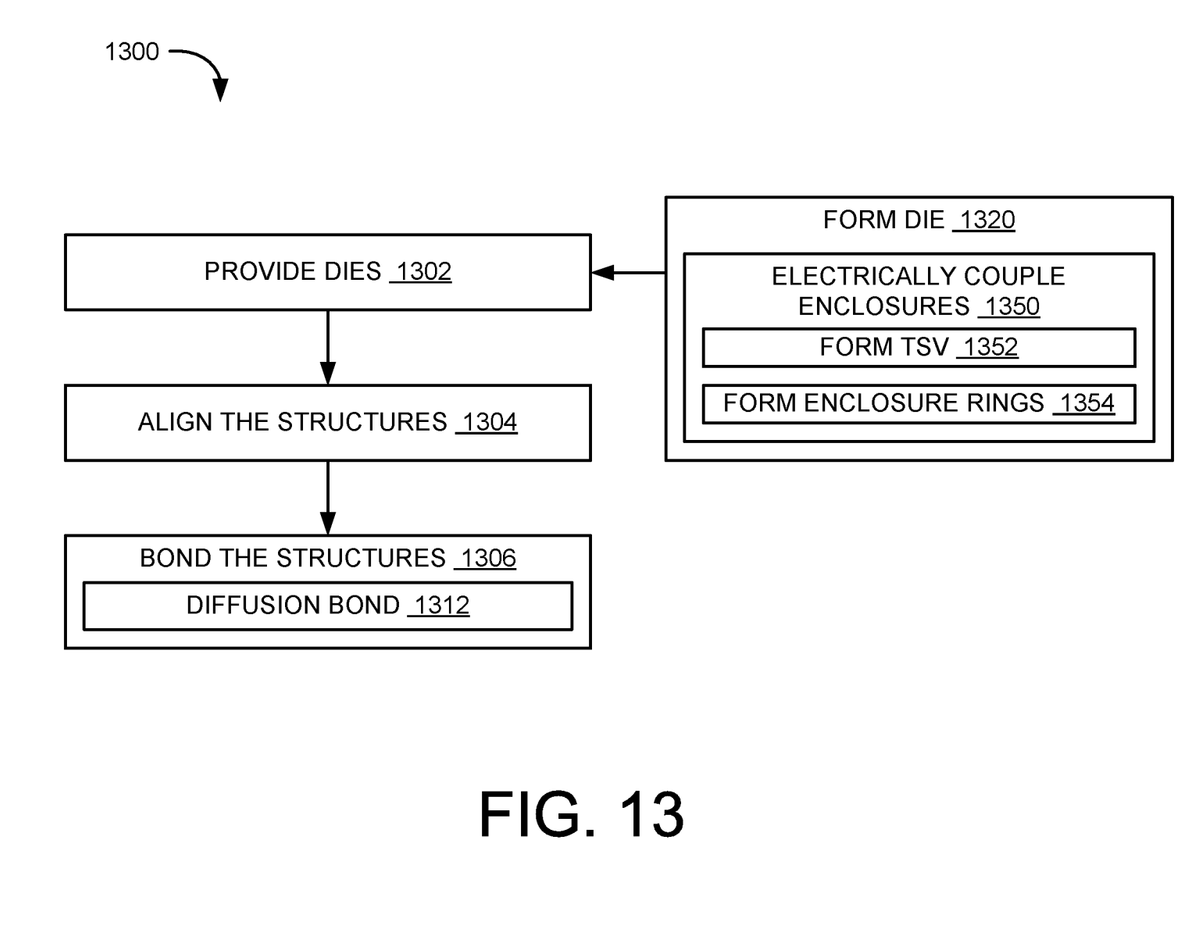
FIG. 13 is a flow diagram illustrating a further example method of manufacturing a semiconductor device in accordance with an embodiment of the present technology.

FIG. 13 is a flow diagram illustrating a further example method 1300 ("method 1300") of manufacturing a semiconductor device in accordance with an embodiment of the present technology. For example, the method 1300 can be implemented to manufacture one or more device stacks for the semiconductor device 200 of FIG. 2, the semiconductor device 300 of FIG. 3, the semiconductor device 400 of FIG. 4, the semiconductor device 500 of FIG. 5, the semiconductor device 600 of FIG. 6, and/or the semiconductor device 700 of FIG. 7. Also for example, the method 1300 can include stages illustrated in FIGS. 8-11.

The method 1300 can include providing semiconductor dies as illustrated at block 1302. Providing the semiconductor die can correspond to the stage(s) illustrated in FIG. 8 and/or FIG. 9. The provided die can include die interconnects (e.g., the die interconnects 804 of FIG. 8, inter connects 904 of FIG. 9, etc.) and a die enclosure (e.g., the die enclosure 810 of FIG. 8, enclosure 910 of FIG. 9, etc.) protruding downward from a die bottom surface. The die enclosure can peripherally surround the die interconnects on or along the die bottom surface. The provided die can further have bottom or distal portions or surfaces of the die interconnects coplanar with bottom or distal portions or surfaces of the die enclosure. For example, the bottom or distal portions of the die interconnects and the die enclosure can be coplanar along a horizontal plane that is parallel to the die bottom surface and is vertically offset from the die bottom surface by a protrusion measure. In some embodiments the die enclosure can include copper, aluminum, nickel, other metals, or a combination thereof.

The die can be manufactured or formed using a separate manufacturing process, as illustrated at block 1320. For example, the die manufacturing process can include wafer-level processing, such as a doping process to form integrated circuitry and a singulating process to separate the individual dies. Also for example, the die manufacturing process can include electrically coupling the enclosures as illustrated at block 1350.

In some embodiments, electrically coupling the enclosures can include forming one or more TSVs (e.g., the periphery TSVs 242 of FIG. 2 at a periphery portion of the corresponding die). For example, the TSVs can be formed based on lithography or etching, masking or depositing seed layer, plating, back-side processing, or a combination thereof.

In some embodiments, electrically coupling the enclosures can also include forming the enclosure rings (e.g., die enclosure) connected to one or more of the TSVs. For example, the enclosure rings can be formed directly contacting or integral with the periphery TSVs 242. The enclosure rings can be formed using a process similar to the TSVs.

The method 1300 can include aligning the structures as illustrated at block 1304 (e.g., the dies and the metal enclosures). Aligning the structures can correspond to the stage illustrated in FIG. 10. For example, the alignment process can align the dies over the substrate with a portion of each die interconnect coincident with a corresponding portion of each substrate interconnect along vertical lines and/or a portion of the die enclosure coincident with the substrate enclosure along vertical lines. Also for example, the alignment process can align the die over the substrate with the die enclosure directly contacting the substrate enclosure.

The method 1300 can further include bonding the structures (e.g., the die interconnects to the substrate interconnects and/or the die enclosure to the substrate enclosure) as illustrated at block 1306. The bonding process can correspond to the stage illustrated in FIG. 11. The bonding process can include controlling temperature of one or more of the structures (e.g., heating to bond and then cooling to solidify the jointed structures), applying pressure on the structures, or a combination thereof. For example, the bonding process can include diffusion bonding (e.g., thermal compression bonding or TCB) as illustrated at block 1312.

Through the bonding process, the enclosures and the enclosed spaces can form. Since metal (e.g., copper, solder, etc.) sufficiently blocks moisture and other debris, underfill is no longer needed for the manufacturing process. As such, the bonding process can bond the structures without any underfill in the enclosed spaces. Further, the above described bonding process can eliminate oxide to oxide bonding (e.g., for hybrid bonding) and/or the requirement on wafer surface conditions (e.g., surface roughness control), which can lead to lower manufacturing cost and error.

In some embodiments, solder bumps can be added to a bottom surface of the bonded structure (e.g., the die stack). In some embodiments, underfill can be applied to the bottom surface of the die stack.

Figure 14:
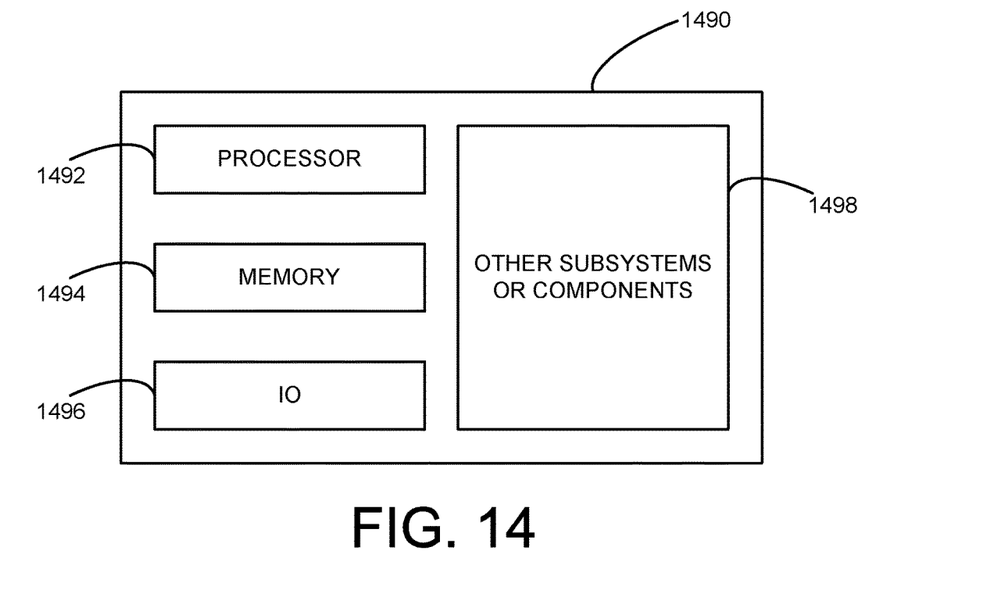
FIG. 14 is a block diagram illustrating a system that incorporates a semiconductor device in accordance with embodiments of the present technology.

FIG. 14 is a block diagram illustrating a system that incorporates a semiconductor device in accordance with embodiments of the present technology. Any one of the semiconductor devices having the features described above with reference to FIGS. 2-13 can be incorporated into any of a myriad of larger and/or more complex systems, a representative example of which is system 1490 shown schematically in FIG. 14. The system 1490 can include a processor 1492, a memory 1494 (e.g., SRAM, DRAM, flash, and/or other memory devices), input/output devices 1496, and/or other subsystems or components 1498. The semiconductor assemblies, devices, and device packages described above with reference to FIGS. 2-13 can be included in any of the elements shown in FIG. 14. The resulting system 1490 can be configured to perform any of a wide variety of suitable computing, processing, storage, sensing, imaging, and/or other functions. Accordingly, representative examples of the system 1490 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1490 include lights, cameras, vehicles, etc. With regard to these and other examples, the system 1490 can be housed in a single unit or distributed over multiple inter-connected units, e.g., through a communication network. The components of the system 1490 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A semiconductor device, comprising:
   a first die;
   a first metal enclosure directly contacting and vertically extending below the first die, wherein the first metal enclosure peripherally encircles a first enclosed space;
   a second die directly contacting the first metal enclosure opposite the first die;
   a second metal enclosure directly contacting and vertically extending below the second die, wherein the second metal enclosure peripherally encircles a second enclosed space; and
   an enclosure connection mechanism directly contacting the first metal enclosure and the second metal enclosure for electrically coupling the first metal enclosure and the second metal enclosure, wherein the enclosure connection mechanism includes one or more through-silicon vias (TSVs) extending vertically through the second die.

2. The semiconductor device of claim 1, wherein the enclosure connection mechanism includes conductive paste.

3. The semiconductor device of claim 2, wherein:
   the conductive paste is continuous along a vertical direction; and
   further comprising:
   a pad directly contacting the conductive paste, wherein the pad is configured to provide an electrical connection to the conductive paste.

4. The semiconductor device of claim 2, further comprising:
   a first die stack including the first die, the first metal enclosure, the second die, and the second metal enclosure;
   a second die stack separated from the first die stack along a horizontal plane, the second die stack including a third metal enclosure between a pair of dies; and
   wherein:
   the conductive paste directly contacts the third metal enclosure for electrically coupling the first metal enclosure and/or the second metal enclosure with the third metal enclosure along a horizontal direction and for electrically coupling across the first die stack and the second die stack.

5. The semiconductor device of claim 1, wherein the enclosure connection mechanism includes one or more bond wires.

6. The semiconductor device of claim 5, wherein the enclosure connection mechanism includes:
   a first bond wire directly connected to the first metal enclosure;
   a second bond wire directly connected to the second metal enclosure; and
   further comprising:
   a pad directly connected to the first bond wire and the second bond wire opposite the first metal enclosure and the second metal enclosure, respectively, wherein the pad is configured to provide an electrical connection to the first bond wire and the second bond wire.

7. The semiconductor device of claim 1, wherein the enclosure connection mechanism includes a metal shield surrounding the first die and the second die, wherein the metal shield directly contacts or is integral with the first metal enclosure and the second metal enclosure.

8. The semiconductor device of claim 7, wherein the metal shield comprises a radio-frequency (RF) shield or an electromagnetic interference (EMI) shield.

9. The semiconductor device of claim 1, wherein the enclosure connection mechanism is configured to electrically couple the first metal enclosure and the second metal enclosure to an electrical ground.

10. The semiconductor device of claim 1, wherein:
    the first die includes a first-die periphery surface;
    the second die include a second-die periphery surface;
    the first metal enclosure includes a first-enclosure periphery surface;
    the second metal enclosure includes a second-enclosure periphery surface; and
    the first-die periphery surface, the second-die periphery surface, the first-enclosure periphery surface, and the second-enclosure periphery surface form a continuous periphery surface.

11. The semiconductor device of claim 10, wherein one or more points or portions on each of the first-die periphery surface, the second-die periphery surface, the first-enclosure periphery surface, and the second-enclosure periphery surface are coincident along a vertical line.

12. The semiconductor device of claim 10, wherein:
    the first-die periphery surface and the second-die periphery surface are aligned and coincident along a vertical line; and
    the first-enclosure periphery surface and the second-enclosure periphery surface are offset from the vertical line toward center portions of the first die and the second die, wherein the first-enclosure periphery surface and the second-enclosure periphery surface are offset by an edge offset distance from the first-die periphery surface and the second-die periphery surface.

13. The semiconductor device of claim 1, wherein the semiconductor device is a three dimensional interconnect (3DI) device.

14. The semiconductor device of claim 1, wherein:
    the first die, the first metal enclosure, the second die, and the second metal enclosure comprise a die stack; and
    further comprising:
    device interconnects attached to a bottom surface of the die stack;
    a device substrate attached to the device interconnects opposite the die stack.

15. A semiconductor device including a die stack having at least two dies, comprising:
    a plurality of interconnects electrically coupling three or more adjacent dies of the die stack;
    a first metal sealing member disposed between a pair of adjacent dies, wherein the first metal sealing member encloses a first set of a plurality of interconnects;

a second metal sealing member below the pair of adjacent dies, wherein the second metal sealing member encloses a second set of a plurality of interconnects; and an enclosure connection mechanism directly contacting the first metal enclosure and the second metal enclosure for electrically coupling the first metal enclosure and the second metal enclosure that are vertically separated with one or more dies there between.

* * * * *